United States Patent
Kumagai et al.

(10) Patent No.: US 10,256,128 B2
(45) Date of Patent: Apr. 9, 2019

(54) COOLING MECHANISM AND PROCESSING SYSTEM

(71) Applicant: TOKYO ELECTRON LIMITED, Tokyo (JP)

(72) Inventors: Keita Kumagai, Iwate (JP); Yoshiaki Sasaki, Yamanashi (JP); Hirohito Kikushima, Yamanashi (JP); Hayato Itomi, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1024 days.

(21) Appl. No.: 14/401,512

(22) PCT Filed: May 2, 2013

(86) PCT No.: PCT/JP2013/062764
§ 371 (c)(1),
(2) Date: Nov. 14, 2014

(87) PCT Pub. No.: WO2013/172209
PCT Pub. Date: Nov. 21, 2013

(65) Prior Publication Data
US 2015/0133044 A1 May 14, 2015

(30) Foreign Application Priority Data

May 16, 2012 (JP) .................................. 2012-112087
Dec. 14, 2012 (JP) .................................. 2012-273363

(51) Int. Cl.
F26B 7/00 (2006.01)
H01L 21/677 (2006.01)
H01L 21/67 (2006.01)
H01L 21/687 (2006.01)
(Continued)

(52) U.S. Cl.
CPC ........ H01L 21/67742 (2013.01); F24F 13/02 (2013.01); H01L 21/02041 (2013.01);
(Continued)

(58) Field of Classification Search
CPC ............ H01L 21/67742; H01L 21/681; H01L 21/68707; H01L 21/67781; H01L 21/67766
(Continued)

(56) References Cited

U.S. PATENT DOCUMENTS 6,466,441 B1 * 10/2002 Suzuki ............... H05K 7/20154
165/104.33
8,668,428 B2 * 3/2014 Hino ........................ B25J 9/042
414/744.5
(Continued)

FOREIGN PATENT DOCUMENTS

JP H10-135306 5/1998
JP H11-330212 11/1999
(Continued)

Primary Examiner — John P McCormack

(57) ABSTRACT

A cooling mechanism includes a plurality of support stands which is provided in a vertical direction over a plurality of stages in an atmospheric transfer chamber where a down-flow is formed, a plurality of support pins which is provided in each of the support stands and supports a target object in contact with the backside of the target object. The cooling mechanism further includes a plurality of air guide plates which is provided in the support stands and cools the target object supported by the support stand located at a lower stage using the down-flow.

12 Claims, 11 Drawing Sheets

(51) Int. Cl.
*F24F 13/02* (2006.01)
*H01L 21/02* (2006.01)
*H01L 21/68* (2006.01)

(52) U.S. Cl.
CPC .. *H01L 21/67109* (2013.01); *H01L 21/67766* (2013.01); *H01L 21/67781* (2013.01); *H01L 21/681* (2013.01); *H01L 21/68707* (2013.01); *Y10S 901/30* (2013.01)

(58) Field of Classification Search
USPC ............ 34/428, 62, 64, 65, 66, 67; 414/287, 414/749.1, 749.4
See application file for complete search history.

(56) References Cited

U.S. PATENT DOCUMENTS

| | | | |
|---|---|---|---|
| 2002/0157692 A1* | 10/2002 | Ishihara | H01L 21/67167 |
| | | | 134/61 |
| 2005/0072716 A1 | 4/2005 | Quiles et al. | |
| 2006/0204356 A1 | 9/2006 | Yamagishi et al. | |
| 2008/0071408 A1* | 3/2008 | Hiroki | H01L 21/681 |
| | | | 700/114 |
| 2010/0290886 A1 | 11/2010 | Hashimoto et al. | |

FOREIGN PATENT DOCUMENTS

| | | | |
|---|---|---|---|
| JP | 2000-077322 A | | 3/2000 |
| JP | 2002-57092 | | 2/2002 |
| JP | 2002-208624 | | 7/2002 |
| JP | 2005-518655 | | 6/2005 |
| JP | 2005-260065 | | 9/2005 |
| JP | 2006-253683 | | 9/2006 |
| JP | 2007-027378 | | 2/2007 |
| JP | 2011-205044 | | 10/2011 |
| KR | 1020120056705 | * | 4/2012 |
| WO | 2010/103876 | | 9/2010 |
| WO | 2010113941 A1 | | 10/2010 |

* cited by examiner

<SIDE VIEW OF THE DETECTION SENSOR>

FIG. 13

<600°C TRANSFER>

| | WAFER EDGES ARE COOLED TO 78°C | | WAFER CENTERS TEMPERATURE AFTER 147 SECONDS | | WAFER EDGES TEMPERATURE AFTER 147 SECONDS | |
|---|---|---|---|---|---|---|
| | CONVENTIONAL EXAMPLE | PRESENT EXAMPLE | CONVENTIONAL EXAMPLE | PRESENT EXAMPLE | CONVENTIONAL EXAMPLE | PRESENT EXAMPLE |
| WAFER OF FIRST SUPPORT STAND | 132 SECOND | 107 SECOND | 67°C | 54°C | 67°C | 55°C |
| WAFER OF SECOND SUPPORT STAND | 177 SECOND | 140 SECOND | 81.5°C | 80°C | 92°C | 74°C |
| WAFER OF THIRD SUPPORT STAND | 185 SECOND | 132 SECOND | 101.5°C | 77°C | 104°C | 70°C |
| WAFER OF FORTH SUPPORT STAND | 186 SECOND | 139 SECOND | 102.5°C | 84°C | 101.5°C | 74°C |

COOLING MECHANISM AND PROCESSING SYSTEM

FIELD OF THE INVENTION

The present invention relates to a cooling mechanism for cooling a target object such as a semiconductor wafer or the like target object, and a processing system using the same.

BACKGROUND OF THE INVENTION

In general, in manufacturing semiconductor devices, semiconductor wafers are repeatedly subjected to various processes such as deposition, oxidative diffusion, modification, etching, annealing and so on. In order to perform such various processes with efficiency, there has been known a so-called cluster tool type processing system as disclosed in Patent Document 1 (Japanese Patent Application Publication No. 2007-027378). In this processing system, a plurality of single wafer type process chambers is connected to a common transfer chamber under a vacuum atmosphere and semiconductor wafers are sequentially subjected to required processes while being transferred to the process chambers via the common transfer chamber.

In this case, one or more small capacity load lock devices capable of selectively implementing a vacuum atmosphere and an air atmosphere are connected to the common transfer chamber. In addition, in order to load/unload the semiconductor wafers between the common transfer chamber of the vacuum atmosphere and the outside of the air atmosphere, by selectively setting the load lock devices to the vacuum atmosphere or the air atmosphere, the semiconductor wafers can be loaded/unloaded without destroying the vacuum atmosphere of the common transfer chamber. Here, each of the load lock devices has a cooling mechanism such as a cooling plate or the like for cooling the semiconductor wafers, which are heated to a high temperature by various heat treatments in the process chambers, to a safe temperature, for example, about 100° C., and the semiconductor wafers are discharged to the outside after being cooled to 100° C. or below.

As other methods for cooling the semiconductor wafers, there have been proposed a method for cooling the semiconductor wafers by using down-flow formed in a transfer chamber of the air atmosphere (see, e.g., Patent Document 2: Japanese Patent Application Publication No. 2006-253683) and a method for installing a cooling station in a transfer chamber of the air atmosphere (see, e.g., Patent Document 3: Japanese Patent Application Publication No. 2005-518655). Further, as for the cooling mechanism of the semiconductor wafer, there have been proposed a technique for providing a cold plate arranged with cooling pipes, (see, e.g., Patent Document 4: a Japanese Patent Application Publication No. 2002-057092) and a technique for cooling central portions of wafers with efficiency by using convex adsorbing portions formed in a central portion of a cooling plate (see, e.g., Patent Document 5: Japanese Patent Application Publication No. 1999-330212).

However, in recent years, there has been proposed a processing system having only process chambers for processing semiconductor wafers in an air atmosphere not in a vacuum atmosphere for the purpose of simplification of the processing system. As used herein, the "air atmosphere" does not refer to an atmospheric pressure exactly but has the concept opposed to a decompressed vacuum atmosphere. In actuality, a pressure range of about ±0.01 Torr with respect to the atmospheric pressure is called "air atmosphere". Examples of processes performed under such an air atmosphere may include annealing, oxidative diffusion, modification and so on.

When heat treatment is performed under the above-mentioned air atmosphere, the load lock devices for selectively implementing the vacuum atmosphere and the air atmosphere are unnecessary and the process chambers can be directly connected to the transfer chamber of the air atmosphere. In this case, in order to cool the wafers to a handling temperature, there is a need to separately provide the cooling mechanisms which would be provided in the load lock devices. However, the cooling mechanisms as disclosed in Patent Documents 2 to 4 are complicated. Therefore, there is a need of a cooling mechanism with a simpler structure.

In light of the above circumstances, it is an object of the present invention to provide a cooling mechanism capable of cooling a target object in an atmospheric transfer chamber with efficiency, and a processing system including the same.

SUMMARY OF THE INVENTION

According to one aspect, there is provided a cooling mechanism including a plurality of support stands which is provided in a vertical direction over a plurality of stages in an atmospheric transfer chamber where a down-flow is formed, a plurality of support pins which is provided in each of the support stands and supports a target object in contact with the rear surface of the target object, and a plurality of air guide plates which is provided in the support stands and cools the target object supported by the support stand located at a lower stage using the down-flow.

According to another aspect, there is provided a cooling mechanism including a plurality of support stands which is provided in a vertical direction over a plurality of stages in an atmospheric transfer chamber, a plurality of support pins which is provided in each of the support stands and supports a target object in contact with the rear surface of the target object, and a cooling means for cooling the central portion of the target object.

According to another aspect, there is provided a cooling mechanism including a plurality of support stands which is provided in a vertical direction over a plurality of stages in an atmospheric transfer chamber where a down-flow is formed, a plurality of support pins which is provided in each of the support stands and supports a target object in contact with the rear surface of the target object, and a side cooling unit for emitting a cooling gas from a side of the target object supported by the support pins and flowing the cooling gas along a surface of the target object.

According to another aspect, there is provided a processing system including an atmospheric transfer chamber of an air atmosphere, a plurality of process chambers which connected to the atmospheric transfer chamber and performs a predetermined process for a target object under the air atmosphere, the above-described cooling mechanism for cooling the target object, and a transfer mechanism which transfers the target object between the process chambers and the cooling mechanism.

Advantages of the Invention

In the cooling mechanism and the processing system according to one embodiment of the present invention, since the down-flow is guided toward the target object by the air guide plates installed in the support stands provided over a plurality of stages in the atmospheric transfer chamber where the down-flow is formed, the target object in the atmospheric transfer chamber can be efficiently cooled.

BRIEF DESCRIPTION OF THE DRAWINGS

FIG. 13 is a view showing results of evaluation on the fifth example according to the embodiment of the present invention.

DETAILED DESCRIPTION OF THE EMBODIMENTS

Hereinafter, examples of a cooling mechanism and a processing system according to an embodiment of the present invention will be described with reference to the accompanying drawings.

(Processing System)

Figure 1:
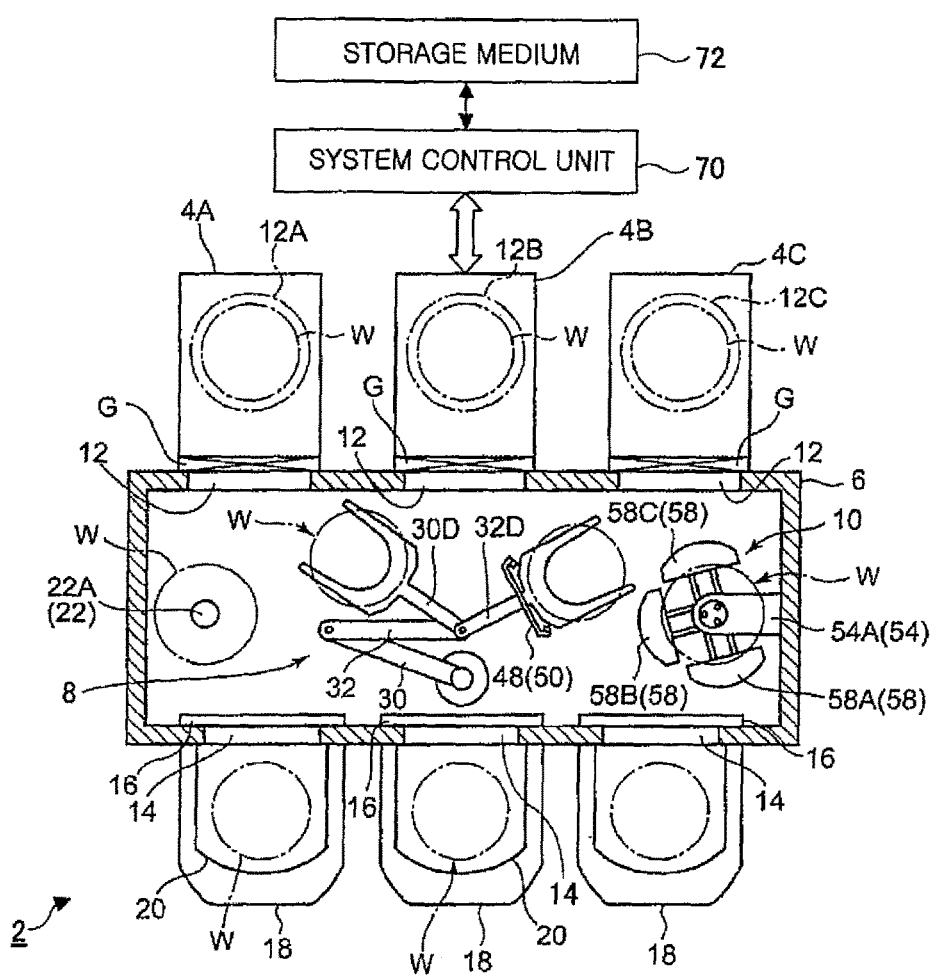
FIG. 1 is a schematic configuration view showing one example of a processing system including a cooling mechanism according to an embodiment of the present invention.
Figure 2:
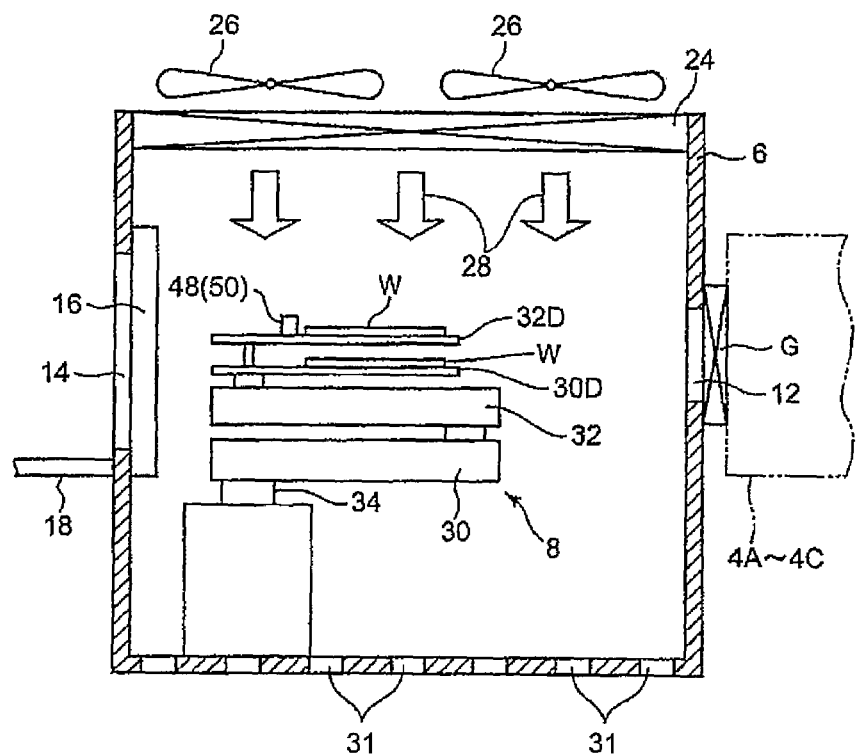
FIG. 2 is a longitudinal sectional view showing an atmospheric transfer chamber according to the embodiment of the present invention.
Figure 3:
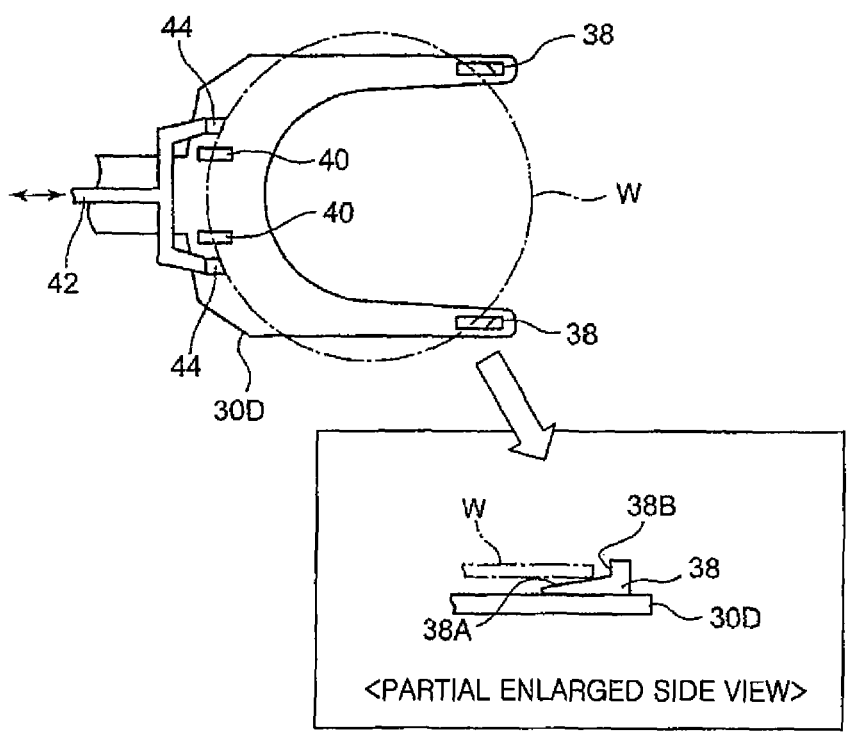
FIG. 3 is a plan view showing a low temperature pick of a transfer mechanism according to the embodiment of the present invention.
Figure 4:
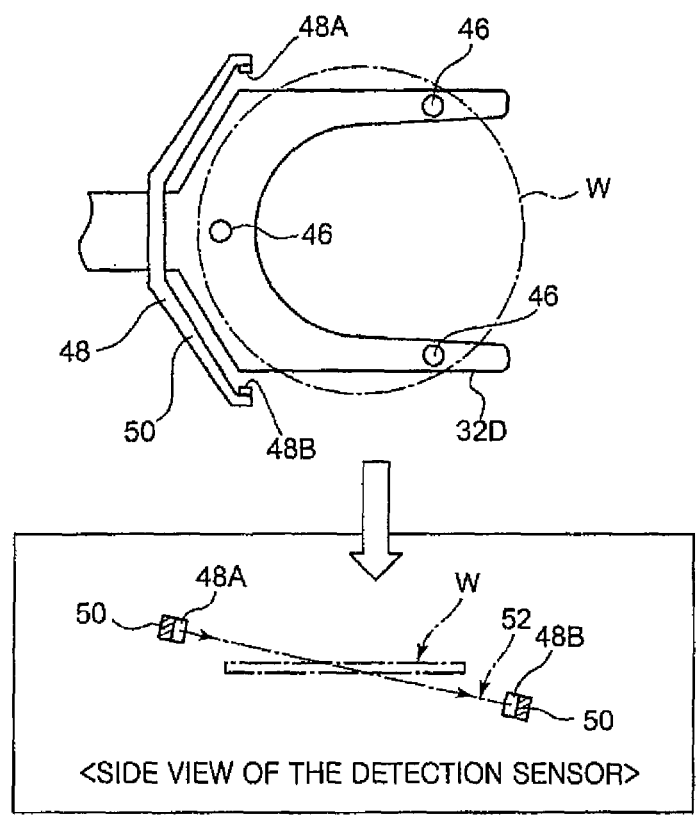
FIG. 4 is a plan view showing a high temperature pick of the transfer mechanism according to the embodiment of the present invention.
Figure 5:
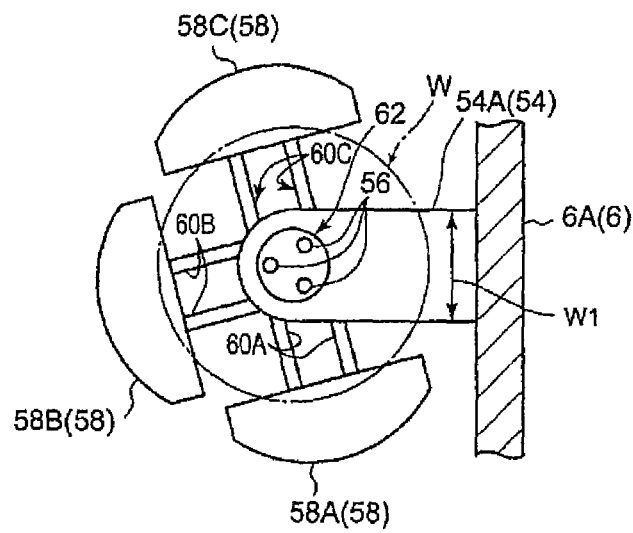
FIG. 5 is an enlarged plan view showing a first example of the cooling mechanism according to the embodiment of the present invention.
Figure 6:
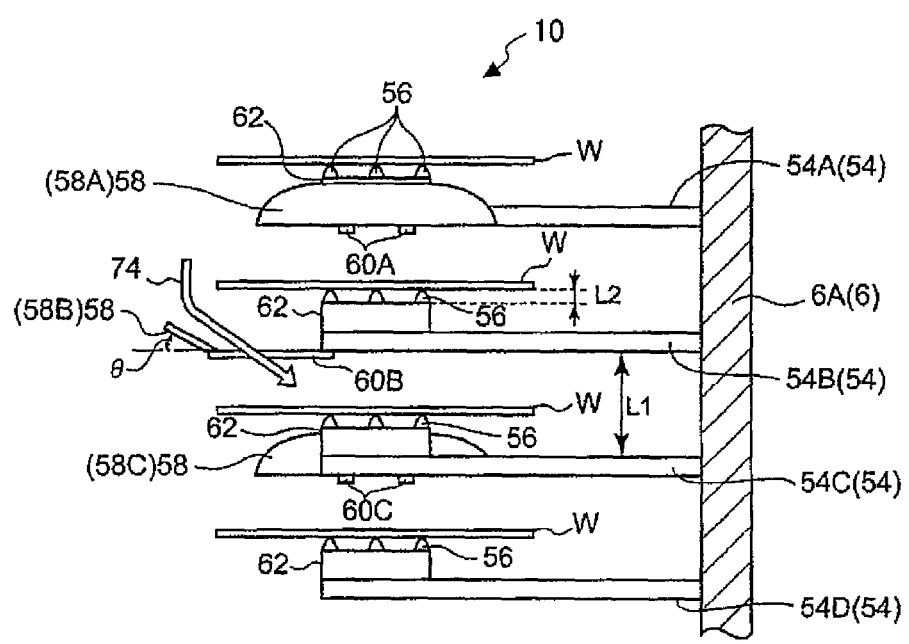
FIG. 6 is an enlarged side view showing the first example of the cooling mechanism according to the embodiment of the present invention.

First, a processing system including a cooling mechanism according to an embodiment of the present invention will be described. FIG. 1 is a schematic configuration view showing one example of the processing system including the cooling mechanism according to the embodiment of the present invention, FIG. 2 is a longitudinal sectional view showing an atmospheric transfer chamber according to the embodiment of the present invention, FIG. 3 is a plan view showing a low temperature pick of a transfer mechanism (including a partially-enlarged side view) according to the embodiment of the present invention, FIG. 4 is a plan view showing a high temperature pick of the transfer mechanism (including a side view of a detection sensor portion) according to the embodiment of the present invention, FIG. 5 is an enlarged plan view showing a first example of the cooling mechanism according to the embodiment of the present invention, and FIG. 6 is an enlarged side view showing one example of the cooling mechanism according to the embodiment of the present invention.

First, as shown in FIG. 1, the processing system 2 mainly includes, e.g., first to third atmospheric process chambers 4A, 4B and 4C for performing heat treatment in an air atmosphere, a rectangular atmospheric transfer chamber 6 under the air atmosphere, a transfer mechanism 8 for transferring a target object to be processed, and a cooling mechanism 10 for cooling the target object.

Mounting tables 12A, 12B and 12C for mounting a semiconductor wafer W which is one example of the target object are respectively provided in the three atmospheric process chambers 4A to 4C in which processing under the atmosphere is performed. This air atmospheric processing may include processing performed at the room temperature and heat treatment performed at a high temperature while supplying a required gas, such as, for example, annealing, oxidative diffusion, modification and so on. Due to this processing, the temperature of the semiconductor wafer W may range from the normal (room) temperature to 600° C. depending on aspects of processing.

The atmospheric transfer chamber 6 is of a rectangular box shape and has three openings 12 formed in one long side wall and the three atmospheric process chambers 4A to 4C are respectively joined to the three openings 12 side by side via respective switchable gate valves G. This configuration allows wafers W to be transfer between among the atmospheric process chambers 4A to 4C through the openings 12.

In addition, a plurality of (for example, 3) loading/unloading openings 14 is formed in another long side wall of the atmospheric transfer chamber 6 and opening/closing doors 16 are respectively slidably provided to open/close the loading/unloading openings 14. In addition, introduction ports 18 are respectively provided to correspond to the loading/unloading openings 14 and may be mounted with respective cassette containers 20. Each of the cassette containers 20 may accommodate a plurality of (for example, 25) semiconductor wafers W at multiple stages in equal pitches. The diameter of each of the semiconductor wafer W is, for example, 300 mm.

Each of the cassette containers 20 is in an airtight-sealed state and is filled with a cleaning gas atmosphere including cleaning air or an inert gas such $N_2$ gas or the like. The cassette containers 20 are provided with respective cover to open/close the cassette containers 20 and the opening/closing doors 16 are equipped with respective cover opening/closing mechanisms (not shown) for opening/closing the covers of the cassette containers 20.

A filter 24 such as a HEPA (High-Efficiency Particulate Air) filter or the like and a blowing fan 26 (see FIG. 2) are provided at a ceiling portion of the atmospheric transfer chamber 6 to form a down-flow 28 of cleaning gas from the ceiling over the entire region in the atmospheric transfer chamber 6. A plurality of exhaust holes 31 through which the down-flow 28 is discharged is formed in the bottom of the atmospheric transfer chamber 6. Some or all of the down-flow 28 is used in a circulating fashion. An example of the down-flow 28 may include cleaning air or an inert gas such as $N_2$ or the like.

Returning to FIG. 1, an orienter 22 for alignment of a semiconductor wafer is provided near one short side of the atmospheric transfer chamber 6. The orienter 22 has a turntable 22A rotated by a driving motor, with the semiconductor wafer W mounted on the turntable 22A. An optical sensor (not shown) for detecting an edge of the semiconductor wafer W is provided in the periphery of the turntable 22A. Specifically, the optical sensor is used to detect position/direction of a positioning cutout (for example, a notch an orientation flat) of the semiconductor wafer W and misalignment of the center of the semiconductor wafer W.

The cooling mechanism 10 according to the embodiment of the present invention is provided in another short side end of the atmospheric transfer chamber 6. Details of the cooling mechanism 10 will be described later. The transfer mechanism 8 for transferring the wafer W is provided in the central portion of the atmospheric transfer chamber 6. The transfer mechanism 8 has two separately-operable picks and can be extended, contracted and pivoted.

In more detail, the transfer mechanism 8 is provided with a first arm 30 and a second arm 32 which are pivotally interconnected in leading and a distal end of the second arm 32 is provided with two coaxial picks 30D and 32D which are separately pivoted. In addition, a base end of the first arm 30 is fixedly attached to a rotary shaft 34 of a biaxial mechanism (see FIG. 2).

When the rotary shaft 34 is rotated in a forward/backward direction, the transfer mechanism 8 can be oriented and extended/contracted (advanced/retreated) and the picks 30D and 32D can be separately pivoted. In addition, the rotary shaft 34 can be elevated in a vertical (X-axis) direction to change a level of overall height of the transfer mechanism 8. The transfer mechanism 8 allows the wafer W to be transferred between the introduction ports 18, the orienter 22, the atmospheric process chambers 4A to 4C and the cooling mechanism 10.

In addition, of the two picks 30D and 32D, one pick 30D serves as a low temperature pick (see FIG. 3) for transferring a low temperature wafer W and the other pick 32D serves as a high temperature pick (see FIG. 4) for transferring a high temperature wafer W mainly. More specifically, the low temperature pick 30D shown in FIG. 3 is formed with, for example, a two-forked aluminum alloy plate. Two oblong holding protrusions 38 are provided in a leading end portion of the top surface of the low temperature pick 30D and two oblong holding protrusions 40 are provided in a proximal end thereof. The rear side of the edge of the wafer W is held on the holding protrusions 38 and 40 in contact. Each of the holding protrusions 38 in the leading end portion has an inclined tapered portion 38A and an erect protruding portion 38B, as shown in a partial enlarged side view of FIG. 3.

In addition, a pusher arm 42 which can advance/retreat and has a two-forked leading end is provided in the base end portion of the low temperature pick 30D. Dampers 44 contacting the outer peripheral end surface of the wafer W are attached to the leading end of the pusher arm 42. With the wafer W held on the holding protrusions 38 and 40, when the pusher arm 42 presses the wafer W to the leading end of the low temperature pick 30) to clip the wafer W between the leading end of the pusher arm 42 and the protruding portion 38B of the holding protrusion 38, the wafer W can be transferred without dropping from the low temperature pick 30D.

In this embodiment, the holding protrusions 38 and 40 and the dampers 44 are made of synthetic resin, such as polybenzoimidazole, whose heat resistance temperature is set to a designed temperature (for example, about 300° C.). In this case, the upper temperature limit for use is about 110° C. A sensor unit for detecting advancement/retreatment of the pusher arm 42 is provided in a base end portion of the pusher arm 42. The low temperature pick 30D may be made of ceramics such as alumina or the like.

The high temperature pick 32D shown in FIG. 4 is formed with, for example, a two-forked high temperature resistant plate and is provided with three high temperature resistant holding protrusions 46 arranged on vertexes forming a triangular shape, with two on a distal end portion of its top surface and one on a proximal end portion thereof. The rear surface of the edge of the wafer W is held on the holding protrusions 46 in contact therewith.

The high temperature resistant material of the high temperature pick 32D and holding protrusions 46 may be ceramics such as alumina or the like. An example of the above-configured transfer mechanism may include a transfer arm as disclosed in Japanese Patent Application Publication No. 2011-205044. The arrangement of the holding protrusions 46 is not limited to the above-mentioned positions. At the proximal end portion of the high temperature pick 32D, there provided a detection sensor 48 for detecting the existence of the wafer W on the high temperature pick 32D. The detection sensor 48 has a sensor mounting arm 50 obliquely and substantially horizontally extending toward the wafer. A light emitting element 48A and a light receiving element 48B are respectively provided in both ends of the sensor mounting arm 50.

In this case, as shown in a side view of the detection sensor in FIG. 4, the light emitting element 48A and the light receiving element 48B are disposed to straddle above and below the horizontal level of the wafer W and an optical axis 52 of the light emitting element 48A is set to be slightly oblique to the planar direction of the wafer W while passing through the plane of the wafer W. The existence of the wafer W can be detected by detecting whether the periphery of the wafer W blocks the optical axis 52. The reason for limitation on the overall height of the detection sensor 48 is to prevent the high temperature pick 32D from interfering with other members when the high temperature pick 32D accesses the atmospheric process chambers 4A to 4C or the cooling mechanism 10.

(First Example of Cooling Mechanism)

Next, the cooling mechanism 10 will be described. As shown in FIGS. 5 and 6, the cooling mechanism 10 mainly includes a plurality of support stands 54 which is provided in a plurality of stages in the vertical direction, a plurality of support pins 56 which is provided in the support stands 54 and supports wafers W in contact with the rear surfaces of the wafers W, and a plurality of air guide plates 58 which is provided at the support stands 54 and cools the wafers N supported by the support stands 54 located in lower stages.

In more detail, in this example, four support stands 54, i.e., first to fourth support stands 54A, 54B, 54C and 54D are provided in that order from above. Each support stand 54 has a plate shape made of, for example, an aluminum alloy. A base end of each support stand 54 is fixed to a wall 6A defining the atmospheric transfer chamber 6. A distance L1 (see FIG. 6) between the support stands 54 is set to, for example, about 40 mm. A width W1 (see FIG. 5) of each support stand 54 is set to be smaller than width of the openings of the two-forked picks 30D and 32D so that the support stands 54 can be introduced into the two-forked picks 30D and 32D when the picks 30D and 32D access the support stands 54.

A heat exchange promotion convex portion 62 made of metallic material having high thermal conductivity is provided, as a cooling unit, in a leading end of each support stand 54 and the support pins 56 are provided on the top surface of the convex portion 62. An example of the metallic material having high thermal conductivity may include an aluminum alloy (which contains aluminum). Three support pins 56 are provided for one heat exchange promotion convex portion 62 and are arranged to have an equilateral triangular shape. These support pins 56 have a so-called ball-pen structure having a leading end provided with quartz balls which can freely roll, to prevent the backside of the wafer W from being scratched. In this case, a distance L2 (see FIG. 6) between the backside of the wafer W and the surface of the heat exchange promotion convex portion 62 is, for example, about 0.3 mm.

The heat exchange promotion convex portion 62 has a disc shape having a diameter of about 100 mm and a height of about 10 mm to promote heat exchange from the central portion of the wafer W to provide efficient cooling. On the other hand, the support pins 56 may be directly provided on the support stands 54 without providing the heat exchange promotion convex portion 62.

The air guide plates 58 are provided at the upper first to third support stands 54A to 54C except the lowermost fourth support stand 54D. These air guide plates 58 include a first air guide plate 58A, a second air guide plate 58B and a third air guide plate 58C from above to below. Each of the air guide plates 58A, 58B and 58C is attached to leading ends of three pairs of support arms 60A, 60B and 60C extending from each of the first to third support stand 54A to 54C. Each air guide plate 58A to 58C is mostly located in the outside of the plane of the wafer W along the tangential direction of the edge of the wafer W. The outer end of each of the air guide plates 58A to 58C has an arc contour.

In addition, in order to guide the down-flow 28 more in the in-plane direction of the wafer W, each air guide plate 58A to 58C is attached under a state where it is inclined toward the center of the wafer W located in the lower stage (immediately below) so that much down-flow can be supplied toward the surface of the wafer W for cooling. An inclination angle θ of each air guide plate 58 falls within, for example, a range of 10 to 20 degrees. In this case, each air guide plate 58 is set at a height to prevent it from interfering with the picks 30D and 32D accessing the cooling mechanism 10.

In this example, the air guide plates 58 are provided at different horizontal positions when viewed in the vertical direction such that the air guide plates 58 do not overlap with one another. For example, as shown in FIG. 5, the first air guide plate 58A is disposed at the left side of the support stands 54 (in the lower side in the figure), the second air guide plate 58B is disposed at the leading end side of the support stands 54, and the third air guide plate 58C is disposed at the right side of the support stands 54 (in the upper side in the figure) and the down-flow 28 makes direct contact with each air guide plate 58A to 58C.

Since wafers W supported by the second and third support stands 54B and 54C located between the first support stand 54A as the uppermost support stand and the fourth support stand 54D as the lowermost support stand are located between hot wafers W located above and below the themselves, the wafers W are most hard to be cooled by the down-flow. Therefore, since more down-flow 28 is formed in the central portion of the atmospheric transfer chamber 6 than the side of the wall defining the atmospheric transfer chamber 6, the second air guide plate 58B cooling the wafer W supported by the third support stand 54C located just above the fourth support stand 54D as the lowermost support stand is disposed at the leading end of the support stands 54 in order to guide more down-flow 28.

This can promote cooling of the wafer W supported by the third support stand 54D which is one of support stands most hard to be cooled among the wafers W supported in the four stages. On the other hand, the second air guide plate 58B guiding much down-flow may be provided at the first support stand 54A promote cooling of the wafer W supported by the second support stand 54B just below the first support stand 54A.

As a result, the air guide plates 58A to 58C are arranged with an angle difference by 90° with respect to the wafer center when viewed from top and the length and width of each of the air guide plates 58A to 58C is, for example, about 50 mm and about 200 mm, respectively. The air guide plates 58A to 58C are made of, for example, stainless steel or the like and the support arms 60A to 60C are also made of, for example, stainless steel or the like.

In this example, the number of support stands 54 is not limited to 4 but may be two or more. For example, assuming that the number of support stands 54 is n (n is an integer of 2 or more), the number of air guide plates 58 is "n−1" except the lowermost support stand.

Returning to FIG. 1, the processing system 2 includes a system control unit 70 having a computer or the like to control the overall system operation. In addition, programs required for the control of the overall system operation are stored in a storage medium 72 such as a flexible disk, a CD (Compact Disc), a hard disk, a flash memory or the like. More specifically, start and stop of supply of gases, control of flow rates of gases, control of process temperature (semiconductor wafer temperature) and process pressure (internal pressure of process chambers), open/close of gate valves G, semiconductor wafer transferring operation under control of the transfer mechanism 8 and so on are performed according to commands from the system control unit 70.

(Operation of Processing System and Cooling Mechanism)

The above-configured processing system 2 and cooling mechanism 10 will be described below. First, the covers of the cassette containers 20 mounted on the introduction ports 18 are separated when the doors 16 are opened and the low temperature pick 30D of the transfer mechanism 8 is used to load unprocessed semiconductor wafers W such as silicon substrates from the cassette containers 22 into the atmospheric transfer chamber 6. When the wafer W is held on the low temperature pick 30D, the wafer W is pressed to the leading end of the pick by the pusher arm 42 (see FIG. 3) and is clipped between the leading end and the holding protrusions 38 to prevent the wafer W from dropping during transfer. The loaded semiconductor wafer W is transferred to the orienter 22 provided at one end of the atmospheric transfer chamber 6 and is aligned in the orienter 22.

The aligned semiconductor wafer W is lifted up by the low temperature pick 30D and is loaded into the one of the first to third atmospheric process chambers 4A to 4C. In this atmospheric process chamber, the gate valve G is closed to seal the atmospheric process chamber and the wafer W is subjected to predetermined heat treatment such as annealing, modification or the like under the air pressure atmosphere. The treated wafer W is in a high temperature state, for example, at the maximum of 600° C. depending on the type of heat treatment. The wafer W in this high temperature state is lifted up by the high temperature pick 32D of the transfer mechanism 8.

If the wafer W in the high temperature state requires additional consecutive heat treatment, the wafer W is transferred into another atmospheric process chamber. When the wafer W is held in the high temperature pick 32D, the existence of the wafer W can be reliably detected by the detection sensor 48 (see FIG. 4) whose optical axis is set to be slightly oblique, even if the wafer W is warped or deformed due to heat.

When the heat treatment is completed in the processing system the wafer W in the high temperature state is lifted up by the high temperature pick 32D and accesses the cooling mechanism 10 provided at the other end in the atmospheric transfer chamber 6. The wafer W in the high temperature state is transferred to an empty support stand 54 of the four first to fourth support stands 54A to 54D of the cooling mechanism 10.

The high temperature wafer W held on the support stand 54 is cooled to a temperature (for example, 100° C., or less), which can be handled by the low temperature pick 30D, by a down-flow 28 (see FIG. 2) of a cleaning gas formed in the atmospheric process chamber 6.

The wafer W cooled so is then lifted up by and held on the low temperature pick 30D of the transfer mechanism 8 and is transferred into the cassette container 20 which is mounted on the introduction port 18 and accommodates processed wafers W. In this example, in order to transfer the wafer W between the support stand 54 and the picks 30D and 32D, the picks 30D and 32D may be slightly elevated in the vertical direction to transfer the wafer W under a state where the picks 30D and 32D are interposed between the support stands 54. The wafer W may be transferred by the high temperature pick 32D instead of the low temperature pick 30D.

An aspect of cooling of the wafer W by the cooling mechanism 10 will be described in detail below. The down-flow 28 (see FIG. 2) of cleaning gas is formed in the atmospheric transfer chamber 6, as described above, and the high temperature wafer W supported by the support stand 54 cooled by the down-flow 28, as shown in FIG. 6. In this case, since there is no obstacle over the wafer W supported by the uppermost first support stand 54A, the entire upper surface of the wafer W makes direct contact with the down-flow 28, thereby achieving efficient cooling of the wafer W.

As opposed to this, the down-flow 28 makes less direct contact with the wafers W supported by the second to fourth support stands 54B to 54D except the first support stand 54A as the wafer W supported by the first support stand 54A acts as an obstacle to block the down-flow 28, which is the cause of hindrance of cooling of the wafers W supported by the second to fourth support stands 54B to 54D.

However, according to one embodiment of the present invention, since the first to third air guide plates 58 (58A to 58C) are respectively provided in the first to third support stands 54A to 54C except the lowermost support stand 54D, the down-flow 28 can be guided to on the surface of the wafers W, thereby providing efficient cooling of the wafers W. That is, since the air guide plates 58 are provided to be downward inclined from the outer side of the wafers toward the center of the wafers in the outer region of the edge of the wafers W, when the down-flow 28 formed in the upper side contacts the air guide plates 58, the down-flow 28 is changed in direction such that the down-flow 28 is obliquely guided and flown toward the center of the wafers in the lower side, as indicated by an arrow 74 in FIG. 6. As a result, the down-flow 28 can contact the upper surface of the wafer W located in the lower stage of the air guide plate 58, that is, the wafer W supported by the support stand 54 of the lower stage, which can result in efficient cooling of the wafer W.

More specifically, the down-flow 28 guided by the first air guide plate 58A provided in the first support stand 54A cools the wafer W supported by the second support stand 54B right below, the down-flow 28 guided by the second air guide plate 58B provided in the second support stand 54B cools the wafer W supported by the third support stand 54C right below, and the down-flow 28 guided by the third air guide plate 58C provided in the third support stand 54C cools the wafer N supported by the fourth support stand 54D right below.

In this case, since the air guide plates 58A to 58C are installed at different positions without overlapping with one another when viewed in the vertical direction, a sufficient amount of down-flow 28 can contact the air guide plates 58A to 58C. Thus, since the down-flow is guided to the wafers W by the air guide plates 58 installed at the support stands 54 provided at a plurality of stages in the cooling mechanism of the target objects W provided in the atmospheric transfer chamber 6 where the down-flow is formed, it is possible to efficiently cool the wafers W in the atmospheric transfer chamber 6. In addition, as a result of efficient cooling of the wafers W, it is possible to improve the processing speed and the productivity.

Furthermore, in this example, since the heat exchange promotion convex portion having a high thermal conductivity is provided at each support stand 54 in association with the central portion of the wafers W, the top surface of the heat exchange promotion convex portion 62 becomes very close to the backside of the central portion of the wafers W, with the distance L2 of about 0.3 mm therebetween (see FIG. 6). As a result, heat exchange in this portion can be promoted to actively cool the central portion of the wafers W. In general, the peripheral portion of the wafers W is easy to be cooled and the central portion of the wafers W is harder to be cooled than the peripheral portion. Therefore, by actively cooling the central portion of the wafers W as described above, it is possible to cool the wafers W as a whole while providing a small temperature difference between the central portion and peripheral portion of the wafers W.

Accordingly, although a large temperature difference between the central portion and peripheral portion of the wafers W is the cause of warpage or deformation of the wafers W, it is possible to prevent the wafers W from being warped or deformed by cooling the wafers W as a whole while providing a small temperature difference between the central portion and peripheral portion of the wafers W.

(Second Example of Cooling Mechanism)

Figure 7:
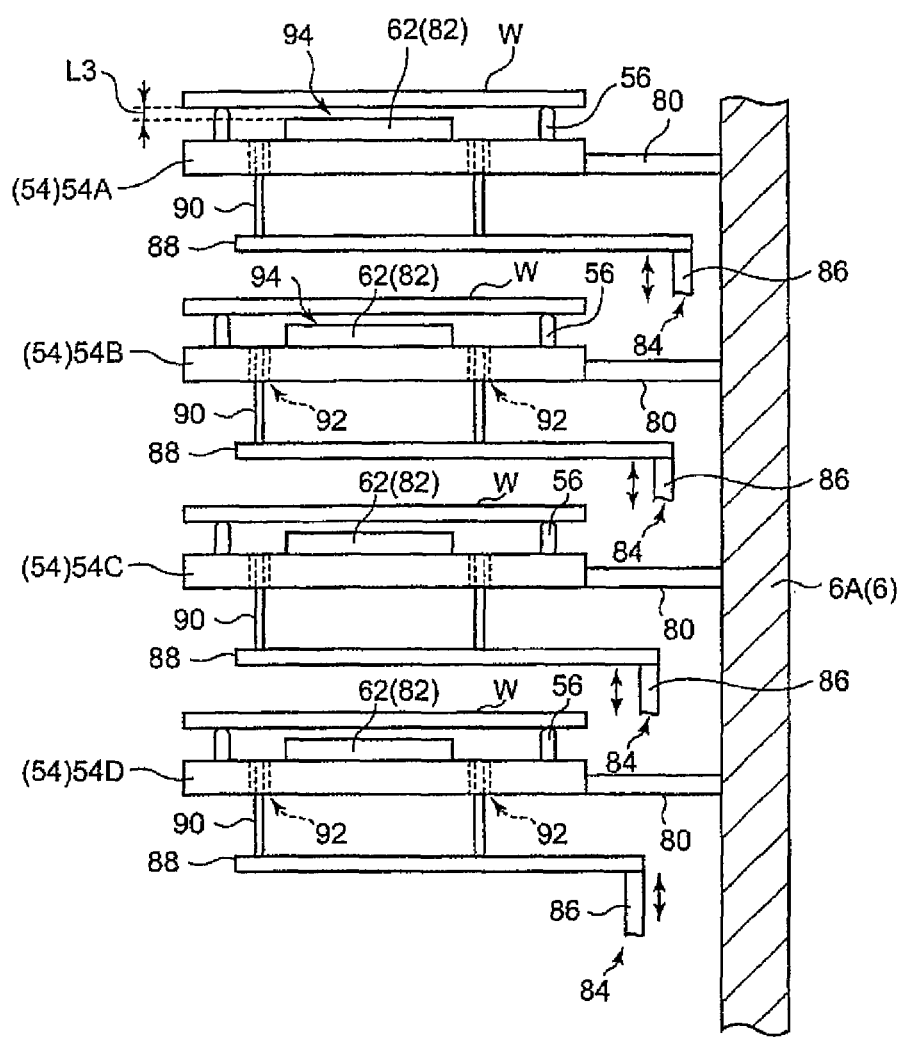
FIG. 7 is a side view showing a second example of the cooling mechanism according to the embodiment of the present invention.
Figure 8:
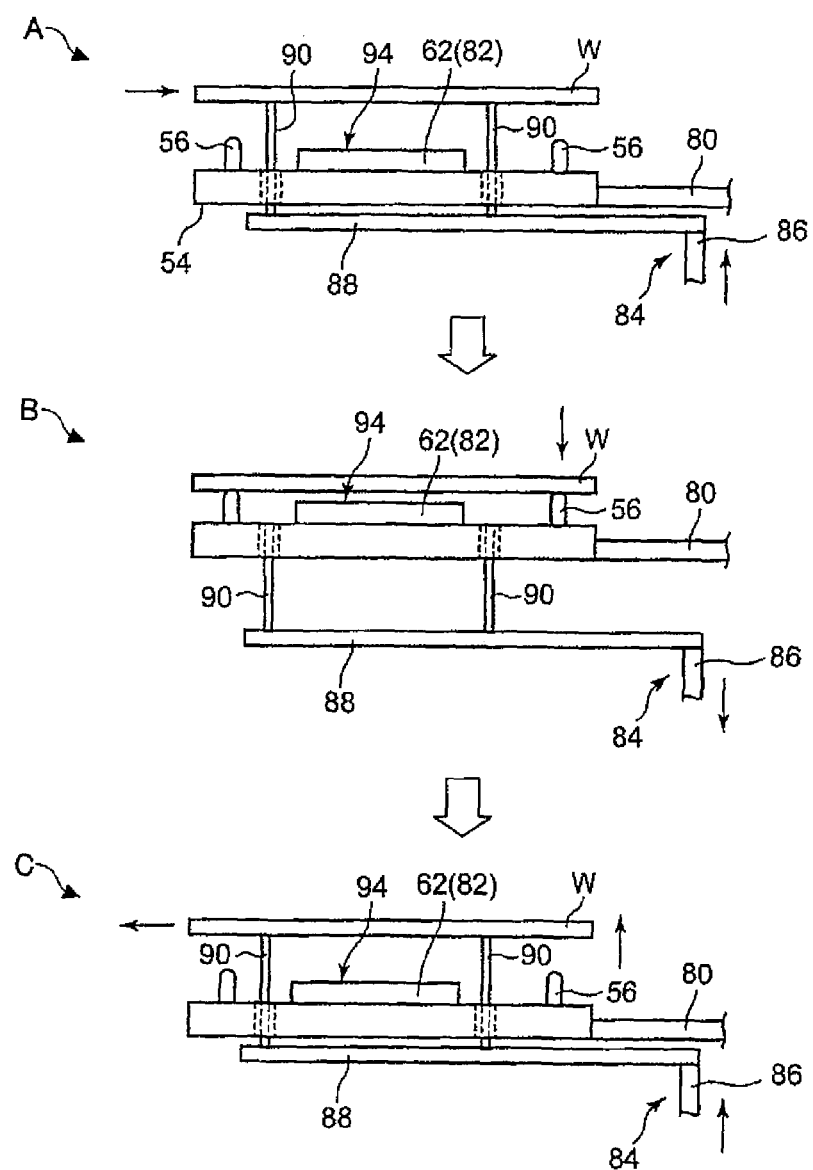
FIG. 8 is an explanatory view for explaining an operation of the second example of the cooling mechanism according to the embodiment of the present invention.

Next, a second example of the cooling mechanism according to the embodiment of the present invention will be described with reference to FIGS. 7 and 8. FIG. 7 is a side view showing a second example of the cooling mechanism according to the embodiment and FIG. 8 is an explanatory view of operation of the second example of the cooling mechanism according to the embodiment. The same elements as those in FIGS. 5 and 6 are denoted by the same reference numerals and explanation of which will not be repeated.

In the previous first example shown in FIGS. 5 and 6, the base ends of the support stands 54 are directly attached to the wall 6A and the air guide plates 58 are used. However, in the second example, the size of the support stands 54 is set so large as to cover the entire wafers W without using the air guide plates 58.

More specifically, each support stand 54 has a disc shape of a size equal to or larger than the size of the wafer W to cover the entire surface of the wafer W and the support stand 54 is fixed to the wall 6A by means of a mounting member 80. In this example, the support stands 54 are vertically provided at four stages, including a first support stand 54A, a second support stand 54B, a third support stand 54C and a fourth support stand 54D in this order from above. The support stands 54 are made of metal material having high thermal conductivity.

Three support pins 56 (only two are shown in FIG. 7) are provided to have a regular triangle at equal intervals in the peripheral portion of the disc-like support stands 54. The wafer W is supported by contacting a leading end of each support pin 56 to the backside of the wafer W. The support pin 56 in the second example is set to be longer than the support pin 56 shown in FIG. 6. A heat exchange promotion convex portion 62 made of metal material having high thermal conductivity as shown in FIG. 6 is provided, as a cooling unit 82, at the central portion of the disc-like support stand 54. An example of the highly-thermal conductive metal material of the heat exchange promotion convex portion 62 and the support stand 54 may include an aluminum alloy (which contains aluminum). In this case, a distance L3 between the backside of the wafer W and the surface of the heat exchange promotion convex portion 62 is, for example, about 0.3 mm, as in the case shown in FIG. 6.

As in the case shown in FIG. 6, the heat exchange promotion convex portion 62 has a disc shape having a diameter of about 100 mm and a height of about 10 mm to promote heat exchange from the central portion of the wafer W to provide efficient cooling. The top surface of the heat exchange promotion convex portion 62 has a planar shape and serves as a central cooling surface 94 in proximity to the backside of the wafer W. Each support stand 54 is provided with a lifter mechanism 84 used when the wafer W is transferred. The lifter mechanism 84 includes an elevating rod 86, a pin support arm 88 which is attached to a leading end of the elevating rod 86 and extends in the horizontal direction, and three lift pins 90 (only two are shown in this example) attached to the pin support arm 88.

The pin support arm 88 has a partially-cut ring shape and the three lift pins 90 are arranged to have an equilateral triangular shape on the ring-like pin support arm 88. Pin insertion holes 92 in which the lift pins 90 are inserted are formed in the support stand 54 in association with the pin support arm 88. As shown in FIG. 8, the wafer W can be vertically moved by inserting/retracting the lift pins 90 in/from the pin insertion holes 92. That is, in order to transfer the wafer W held on the pick 30D or 32D to the support stand 54, the lift pins 90 are moved upward through the pin insertion holes 92 beyond the support stand 54 from below the support stand 54, so that the wafer W is transferred to the lift pins 90 (Step A in FIG. 8).

In addition, in this state, as shown in Step B in FIG. 8, by descending the lift pins 90, the wafer W is transferred onto the support pins 56. In addition, in order to transfer the wafer W on the support pins 56 to the pick 30D or 32D, an operation reverse to the earlier-described operation is performed. That is, as shown in Step C in FIG. 8, by ascending the lift pins 90, the wafer W is lifted up and, in this state, an empty pick 30D or 32D is moved below the wafer W and the wafer W is transferred to the pick 30D or 32D by descending the lift pins 90.

In this example, while each wafer W is being cooled by the down-flow 28 (see FIG. 2), the wafer W is further cooled as heat from the wafer W is emitted to the highly-thermal conductive support stand 54. At this time, as in the example shown in FIG. 6, even in the second example, since the highly-thermal conductive heat exchange promotion convex portion 62 is provided at each support stand 54 in association with the central portion of the wafer W, the top surface of the heat exchange promotion convex portion 62 becomes very close to the backside of the central portion of the wafers W, with the distance L3 of about 0.3 mm therebetween (see FIG. 7).

As a result, heat exchange in this portion can be promoted to actively cool the central portion of the wafers W. In general, the peripheral portion of the wafers W is easy to be cooled and the central portion of the wafers W is harder to be cooled than the peripheral portion. Therefore, by actively cooling the central portion of the wafers W as described above, it is possible to cool the wafers W as a whole while providing a small temperature difference between the central portion and peripheral portion of the wafers W.

Accordingly, although a large temperature difference between the central portion and peripheral portion of the wafers W is the cause of warpage or deformation of the wafers W, it is possible to prevent the wafers W from being bent or deformed by cooling the wafers W as a whole while providing a small temperature difference between the central portion and peripheral portion of the wafers W.

As described above, according to the second example, in the cooling mechanism of a target object W provided in the atmospheric transfer chamber 6, since the cooling unit 82 for cooling the central portion of the target object is provided at each of the support stands 54 provided in a plurality of stages, the target object in the atmospheric transfer chamber 6 can be efficiently cooled and further the central portion of the target object which may be cooled later than its peripheral portion can be efficiently cooled, thereby preventing the target object from being warped or deformed. In the second example, the air guide plates 58 used in the first example shown in FIG. 6 may be used.

(Third and Fourth Examples of Cooling Mechanism)

Figure 9A:
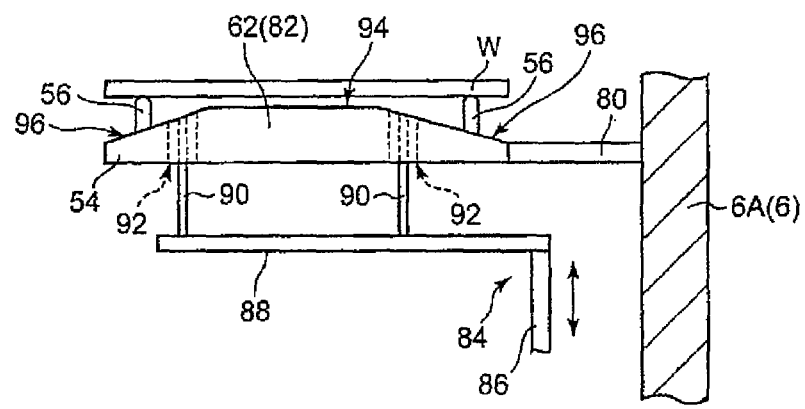
FIG. 9A is a view showing a portion of a third example of the cooling mechanism according to the embodiment of the present invention.
Figure 9B:
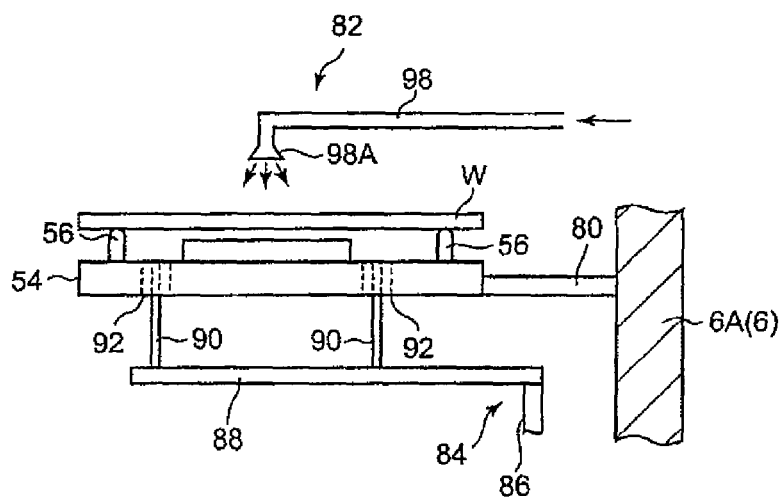
FIG. 9B is a view showing a portion of a fourth example of the cooling mechanism according to the embodiment of the present invention.

Next, third and fourth examples of the cooling mechanism according to the embodiment of the present invention will be described. FIG. 9A is a view showing a portion of the third example of the cooling mechanism according to the embodiment. FIG. 9B is a view showing a portion of the fourth example of the cooling mechanism according to the embodiment. The same elements as those shown in FIGS. 6 to 8 are denoted by the same reference numerals and explanation of which will not be repeated.

Although only one support stand 54 is shown in these figures for the purpose of simplification, a plurality of (for example, 4) support stands may be provided as in the previous examples. In addition, although the heat exchange promotion convex portion 62 as the cooling unit 82 shown in FIG. 7 has a stepped shape with respect to the support stand 54, without being limited thereto, both may be integrally formed and the heat exchange promotion convex portion 62 may have an inclined surface to increase its thickness from its peripheral portion to its central portion. This third example is shown in FIG. 9A.

That is, as shown in FIG. 9A, in this example, the disc-like support stand 54 and the heat exchange promotion convex portion 62 as the cooling unit 82 are integrally formed, and the thickness of the support stand 54 is gradually increased from its peripheral portion to its central portion such that the support stand 54 has an inclined surface 96 up to a horizontal cooling surface 94. That is, the entire support stand 54 has a truncated conical shape. This case can also show the same operation and effects as the second example described with reference to FIGS. 7 and 8.

In addition, in the fourth example shown in FIG. 9B, a cooling gas injecting portion 98 for blowing a cooling gas is provided, as the cooling unit 82, above the support stand 54, instead of the heat exchange promotion convex portion 62 as the cooling unit 82 of the second example shown in FIGS. 7 and 8. More specifically, the cooling gas injecting portion 98 is provided above the central portion of the wafer W in association and the cooling gas is ejected from an ejected nozzle 98A provided in the cooling gas injecting portion 98 toward the central portion of the top surface of the wafer W to cool the central portion particularly. An example of the cooling gas may include, but is not limited to, nitrogen gas.

In this case, since the central portion of the wafer W can be efficiently cooled by the cooling gas, a difference in temperature between the peripheral portion and central portion of the wafer W can be limited to be smaller, the fourth example can show the same operation and effects as the previous second and third examples.

(Fifth Example of Cooling Mechanism)

Figure 10:
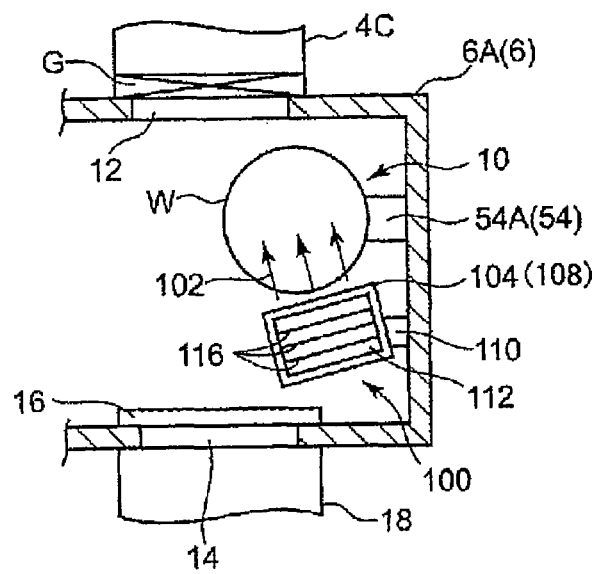
FIG. 10 is a partial sectional view showing a portion of a fifth example of the cooling mechanism according to the embodiment of the present invention.
Figure 11:
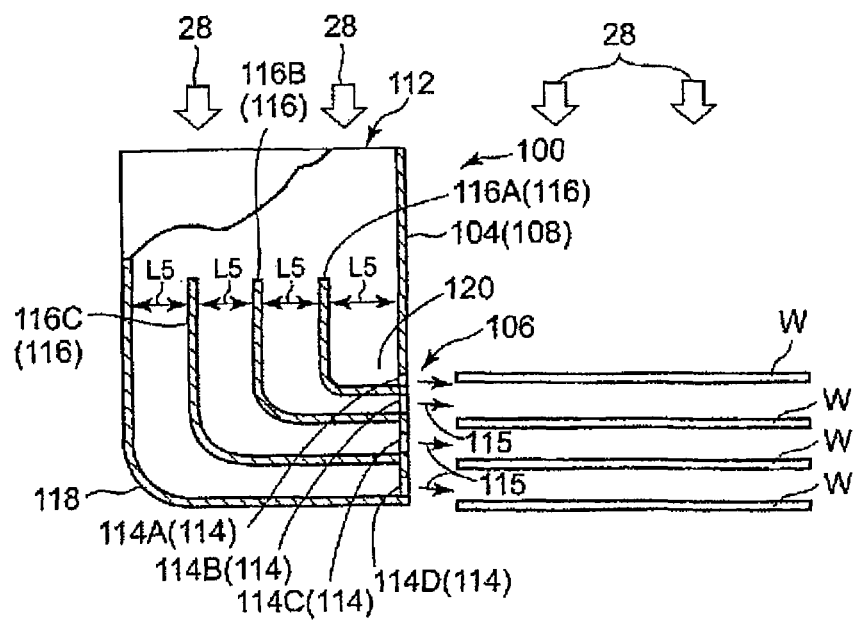
FIG. 11 is an enlarged longitudinal sectional view showing a positional relationship between a side cooling unit and a semiconductor wafer in the fifth example.
Figure 12:
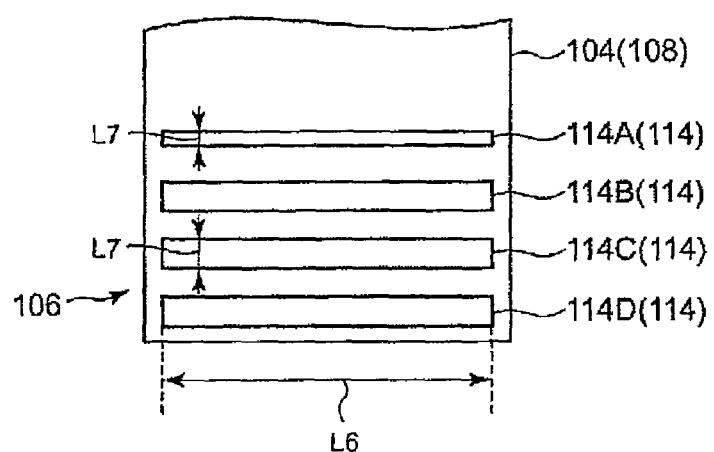
FIG. 12 is a partially-enlarged plan view showing a gas outlet of the side cooling unit of FIG. 11.

Next, a fifth example of the cooling mechanism according to the embodiment of the present invention will be described with reference to FIGS. 10 to 12. FIG. 10 is a partial sectional view showing a portion of the fifth example of the cooling mechanism according to the embodiment of the present invention, FIG. 11 is an enlarged longitudinal sectional view (support stand not shown) showing a positional relationship between a side cooling unit and a semiconductor wafer in the fifth example, and FIG. 12 is a partially-enlarged plan view showing a gas outlet of the side cooling unit of FIG. 11. The same elements as those in FIGS. 1 to 9 are denoted by the same reference numerals and explanation of which will not be repeated.

Although it has been illustrated in the first example shown in FIG. 5 that the air guide plates 58 are provided in the support stands 54, in the fifth example, a side cooling unit 100 is provided instead of or in combination with them. The side cooling unit 100 is arranged at a position which does not interfere with the operation of the transfer mechanism 8. The side cooling unit 100 is configured to emit and flow a cooling gas 102 from a side of the semiconductor wafer W as a target object supported by the support stand 54 along the surface of the wafer W.

More specifically, the side cooling unit 100 includes a cooling gas passage 104 for flowing the cooling gas 102, and a gas outlet 106 which is provided at an exit of the cooling gas passage 104 and is located at the lateral side of the wafer W. In this example, the cooling gas passage 104 has a rectangular section and its interior is formed by a hollow passage duct 108. This passage duct 108 is made of, for example, stainless steel and is provided to erect and extend in a height direction, i.e., a vertical direction, at the side of the support stand 54.

The passage duct 108 is fixed to the side wall 6A of the atmospheric transfer chamber 6 by a support arm 110. The length and breadth of the plane of the passage duct 108 is set to, for example, about 300 mm×300 mm and its vertical length is set to, for example, about 300 mm.

The top of the passage duct 108 is formed as an inlet 112 for receiving the down-flow falling from the ceiling. In this example, the down-flow 28 is used as the cooling gas 102. In this case, a partitioning wall of the peripheral portion of the inlet 112 may be formed to be inclined such that it is gradually enlarged toward above and an area of the inlet 112 is enlarged, thereby receiving more down-flow 78.

The gas outlet 106 is provided by forming an opening in a side wall of the bottom of the passage duct 108. More specifically, the gas outlet 106 has a plurality of (four in this example) gas discharge ports 114 formed to extend in the horizontal direction in association with the wafer W. In addition, a plurality of guide partition plates 116 extending along the interior of the cooling gas passage 104 is provided to partition the gas discharge ports 114. These gas discharge ports 114 include first to fourth gas discharge ports 114A, 114B, 114C and 114D in this order from above.

In this case, the second to fourth gas discharge ports 114B to 114D except the uppermost first gas discharge port 114A are set to be located between wafers W supported vertically at four stages by the first to fourth support stands 54A to 54D. That is, the second to fourth gas discharge ports 114B to 114D are provided so as to correspond to the three wafers except the uppermost wafer.

Accordingly, the cooling gas 102 emitted horizontally from the second to fourth gas discharge ports 114B to 114D is slightly curved downward by gravity such that the cooling gas 102 effectively flows along the surface of the wafer W when it is flown obliquely downward, as indicated by an arrow 115 in FIG. 11.

In this case, since the top surface of the wafer W supported by the uppermost first support stand 54A is efficiently cooled in direct contact with the down-flow 28 falling from the ceiling, a cooling gas from the side cooling unit 100 is not particularly necessary. For this reason, like the second gas discharge port 114B, the first gas discharge port 114A is set to be located at a horizontal level between the wafer W supported by the uppermost first support stand 54A and the wafer W supported by the second support stand 54B. The first gas discharge port 114A functions to prevent a turbulent flow of the cooling gas from occurring in the passage duct 108, as will be described later.

The guide partition plates 116 partitioning the gas discharge ports 114A to 114D include first, second and third guide partition plates 116A, 116B and 116C. Accordingly, the interior of the passage duct 108 is longitudinally partitioned into four sections. Each of the first to third guide partition plates 116A to 116C is of an L-like shape and has a curved corner to allow the down-flow to smoothly flow in the horizontal direction. Accordingly, each of the first to third guide partition plates 116A to 116C is formed by a vertical portion extending in the vertical direction, an arc-like curved portion, and a horizontal portion extending in the horizontal direction.

A lower leading end of the first guide partition plate 116A is connected to a side wall of the passage duct 108 between the first and second gas discharge ports 114A and 114B, a lower leading end of the second guide partition plate 116E is connected to a side wall of the passage duct 108 between the second and third gas discharge ports 114B and 114C, and a lower leading end of the third guide partition plate 116O is connected to a side wall of the passage duct 108 between the third and fourth gas discharge ports 114C and 114D.

In addition, the corner 118 of the partition wall of the bottom in the opposite side of the gas outlet 106 of the passage duct 108 has an arc-like section to allow the down-flow to be smoothly changed by 90 degrees. In this example, a distance L5 between each of the first to third guide partition plates 116A to 116C and a partition wall of the front side and rear side of the passage duct 108 falls within a range of about 70 to 80 mm. In addition, the down-flow tends to stay in a region between the first guide partition plate 116A and the partition wall of the front surface of the passage duct 108. In order to avoid this, the first gas discharge port 114A is formed to discharge the cooling gas.

In addition, a width L6 (see FIG. 12) of each of the gas discharge ports 114A to 114D may be set to fall within a range of radius to diameter of the wafer W. For example, for a 300 mm diameter wafer, the width L6 is set to fall within a range of 150 to 300 mm to provide efficient cooling of the wafer. In addition, opening areas of the gas discharge ports 114A to 114D are set such that flow velocities of cooling gases emitted from the first to fourth gas discharge ports 114A to 114D become approximately equal to each other.

For this reason, a height L7 (see FIG. 12) of each of the gas discharge ports 114A to 114D is set to fall within a range of, for example, 15 to 25 mm and a flow velocity of the cooling gas emitted therefrom is set to fall within a range of 0.3 to 1.5 m/sec. A flow velocity of the down-flow falling from the ceiling falls within a range of, for example, 0.2 to 0.4 m/sec.

The height L7 of the first gas discharge port 114A which prevents occurrence of a turbulent flow may be set to be smaller than the height L7 of the other second to fourth gas discharge ports 114B to 114D. In addition, an adjustment plate to adjust an opening area may be provided in each of the gas discharge ports 114A to 114D.

In the above-configured fifth example, since the down-flow 28 makes direct contact with the entire top surface of the wafer supported at the uppermost stage by the first support stand 54A (see FIG. 6), it is possible to provide efficient cooling, as in the previous examples.

As opposed to this, the wafers W supported by the second to fourth support stands 54B to 54D can be efficiently cooled by the cooling gas emitted from the side cooling unit 100 although the down-flow 28 makes no direct contact with these wafers W. That is, some of the down-flow 28 from the ceiling is received in the passage duct 108 via the inlet 112 provided in the top of the passage duct 108 of the cooling unit 100. The received down-flow 28 is guided and flown to each of the guide partition plates 116A to 116C and the partition wall of the passage duct 108 and is smoothly bent from the downward direction to the horizontal direction.

The down-flow 28 bent to the horizontal direction acts as the cooling gas 102 and is discharged in the horizontal direction through the first to fourth gas discharge ports 114A to 114D of the gas outlet 106. The discharged cooling gas 102 makes contact with the surfaces of the wafers W supported at the second to fourth stages except the wafer supported at the uppermost stage and flows in the horizontal direction along the surfaces while cooling the wafers W. In this case, some of the cooling gas 102 makes contact with and cools the lower surfaces (backsides) of the wafers supported at the first to third stages.

Accordingly, it is possible to efficiently and promptly cool the wafers W to a predetermined temperature. For example, when the wafers are transferred, the wafers contacting the pick 30D of the transfer mechanism 8 can be promptly cooled to the heat resistant temperature of the pick 30D, for example, 80° C. or less.

(Results of Evaluation on Fifth Example)

Next, results of evaluation on the above-experimented fifth example will be described. Here, a cooling rate of four wafers whose temperature is 600° C. at the time of transfer from process chamber is measured. As a comparative example, the same experiment was performed for a conventional example provided with only support stands (a structure provided with no air guide plate in FIG. 5). A result at that time is shown in FIG. 13. FIG. 13 is a view showing results of evaluation on the fifth example according to the embodiment of the present invention. In this experiment, the time periods after four wafers were supported by the cooling mechanism until the temperatures of wafer edges reached 78° C. by the cooling was measured and temperatures of wafer centers and wafer edges were measured at 147 seconds after the wafers were supported.

Referring to FIG. 13, in the conventional example, time for which a wafer edge is cooled to 78° C. is 177 to 186 seconds except a wafer at the uppermost stage. As opposed to this, in the fifth example, this time is 107 to 140 seconds which are shorter than that in the conventional example, which means that the wafer edge can be more efficiently cooled.

In addition, a cooling rate of the wafer supported at the uppermost stage becomes high. It is considered that the reason for this a contribution of a cooling gas contacting the backside (lower surface) of the wafer. In addition, in the conventional example, the temperature of the wafer center at 147 seconds after the wafer is supported by the cooling mechanism is within a range of 81.5 to 102.5° C. except the wafer at the uppermost stage. As opposed to this, in the fifth example, this temperature is within a range of 54 to 84° C., which means more efficient wafer cooling.

In addition, in the conventional example, the temperature of the wafer edge at 147 seconds after the wafer is supported by the cooling mechanism is within a range of 92 to 104° C. except the wafer at the uppermost stage. As opposed to this, in the fifth example, this temperature is within a range of 55 to 74° C., which means more efficient wafer cooling. In particular, it can be seen from the figure that the wafer edge contacting the pick 30D is cooled to a heat resistant temperature (for example, 80° C.) or less of the pick 30D.

Although the first gas discharge port 114A is provided for prevention of a turbulent flow in the fifth example, this may not be provided. In addition, although the horizontal level of each of the gas discharge ports 114A to 114D is set to be located between the wafers W, without being limited thereto, horizontal levels of other gas discharge ports 114B to 114D except the first gas discharge port 114A may be set to be equal to horizontal levels of other wafers except the wafer at the uppermost stage. Further, although the guide partition plates 116A to 116C are provided in the passage duct 108, these may not be provided.

In addition, although the down-flow is used as the cooling gas in the fifth example, without being limited thereto, a $N_2$ gas source or a rare gas source such as He or the like may be connected to the passage duct 108 as the cooling gas passage 104 and an inert gas such as $N_2$, He or the like may be used as the cooling gas. In addition, the side cooling unit 100 of the fifth example may be provided in combination with the previous first to fourth examples.

As described above, according to the above examples, in the cooling mechanism of the target object provided in the atmospheric transfer chamber where the down-flow is formed, since the down-flow is guided toward the target object by the air guide plates installed at the support stands provided in a plurality of stages, the target object in the atmospheric transfer chamber can be efficiently cooled.

In addition, according to the above examples, in the cooling mechanism of the target object provided in the atmospheric transfer chamber, since the cooling unit for cooling the central portion of the target object is provided in each of the support stands provided in the plurality of stages, the target object in the atmospheric transfer chamber can be efficiently cooled. Further, since the central portion of the target object which tends to be cooled later than its peripheral portion can be efficiently cooled, it is possible to prevent the target object from being warped or deformed.

In addition, according to the above examples, in the cooling mechanism of the target object provided in the atmospheric transfer chamber where the down-flow is formed, since the cooling gas is emitted from the side of the target object by the side cooling unit and is flown along the surface of the target object, the target object in the atmospheric transfer chamber can be efficiently cooled.

In addition, according to the above examples, in the cooling mechanism of the target object provided in the atmospheric transfer chamber where the down-flow is formed, since the cooling gas is emitted from the side of the target object by the side cooling unit and is flown along the surface of the target object, the target object in the atmospheric transfer chamber can be efficiently cooled.

Although the cooling mechanism and the processing system have been described by way of examples, the present invention is not limited to the above examples but may be changed and modified in different ways without departing from the scope of the invention. In addition, the above examples may be combined unless inconsistent.

For example, in the above examples, a cooling pipe for flowing a refrigerant into each support stand 54 may be provided to cool the wafer by force. In addition, although the target object has been illustrated with the semiconductor wafer, the semiconductor wafer may include a silicon substrate and a compound semiconductor substrate such as GaAs, SiC, GaN and the like and, without being limited to these substrates, the present invention may be applied to glass substrates, ceramic substrates and the like used for liquid crystal displays.

In addition, the air guide plates may be provided in at least one of the plurality of support stands except the lowermost support stand. However, the air guide plates may be preferably provided in all support stands except the lowermost support stand.

In addition, the wafer W described in the above examples is one example of the target object. However, without being limited thereto, the target object may be any substrate.

The cooling mechanism of the present invention is summarized below.

1. A cooling mechanism including a plurality of support stands which is provided in a vertical direction at a plurality of stages in an atmospheric transfer chamber where a down-flow is formed, a plurality of support pins which is provided at each of the support stands and supports a target object in contact with the backside of the target object, and a plurality of air guide plates which is provided at the support stands and cools the target object supported by the support stand located at a lower stage using the down-flow.

2. The cooling mechanism of item 1, wherein the air guide plates are respectively attached to the support stands via support arms in an inclined state to guide the down-flow in an in-plane direction of the target object.

3. The cooling mechanism of item 2, wherein the air guide plates are provided at different installation position in a horizontal direction when viewed in a vertical direction such that the air guide plates do not overlap with each other in the vertical direction.

4. The cooling mechanism of item 1, wherein a heat exchange promotion convex portion made of metal material having high thermal conductivity is provided as a cooling unit in each of the support stands in association with the central portion of the target object.

5. The cooling mechanism of item 4, wherein the support pins are provided in the top surface of the heat exchange promotion convex portion.

6. A cooling mechanism including a plurality of support stands which is provided in a vertical direction at a plurality of stages in an atmospheric transfer chamber, a plurality of support pins which is provided in each of the support stands and supports a target object in contact with the backside of the target object, and a cooling unit for cooling the central portion of the target object.

7. The cooling mechanism of item 6, wherein the cooling unit includes a cooling gas injecting portion which emits a cooling gas in association with the central portion of the target object.

8. The cooling mechanism of item 6, wherein the cooling unit has a planar top surface and a central cooling surface in proximity to the backside of the target object.

9. The cooling mechanism of item 8, wherein the cooling unit has a heat exchange promotion convex portion which is made of metal material having high thermal conductivity and is arranged in association with the central portion of the target object, with its top surface formed as the central cooling surface.

10. The cooling mechanism of item 8, wherein the cooling unit has an inclined surface which gradually thickens as the support stands come from a peripheral portion to a central portion and the central portion serves as the central cooling surface.

11. The cooling mechanism of item 6, wherein a down-flow is formed in the atmospheric transfer chamber and a plurality of air guide plates for cooling the target object supported by the support stand located at a lower stage using the down-flow is provided in the support stands.

This international application claims the benefits of Japanese Patent Application Nos. 2012-112087, filed on May 16, 2012, and 2012-273363, filed on Dec. 14, 2012, in the Japan Patent Office, the contents of which are incorporated herein in their entirety by reference.

REFERENCE NUMERALS

2: processing system
4A, 4B, 4C: atmospheric process chamber
6: atmospheric transfer chamber
8: transfer mechanism
10: cooling mechanism
28: down-flow
30: first arm
32: second arm
30D: low temperature pick
32D: high temperature pick
48: detection sensor
48A: light emitting element
48B: light receiving element
52: optical axis
54 (54A, 54B, 54C): support stand
56: support stand
58 (58A, 58B, 58C): air guide plate
60A, 60B, 60C: support arm
62: heat exchange promotion convex portion
82: cooling unit
92: central cooling surface
96: inclined surface
98: cooling gas injecting portion
100: side cooling unit
102: cooling gas
104: cooling gas passage
106: gas outlet
108: passage duct
112: inlet
114, 114A-114D: gas discharge port
116, 116A-116C: guide partition plate
W: semiconductor wafer

What is claimed is:

1. A cooling mechanism comprising:
a plurality of support stands disposed in a vertical direction at a plurality of stages in an atmospheric transfer chamber, wherein a down-flow is formed and a transfer mechanism for transferring a target object is disposed in a central portion of the atmospheric transfer chamber;
a plurality of support pins disposed at each of the plurality of support stands and configured to support the target object in contact with a backside of the target object; and
a side cooling unit configured to: emit a cooling gas from a side of the target object supported by the support pins; and allow the cooling gas to flow along a surface of the target object, wherein the side cooling unit includes: a cooling gas passage configured to allow the cooling gas to flow; and a gas outlet disposed at an exit of the cooling gas passage and is located at a lateral side of the target object,
wherein the cooling gas passage vertically extends and has an upper end formed as an inlet to receive the down-flow and the down-flow is used as the cooling gas,
wherein the gas outlet has a plurality of gas discharge ports extending in a horizontal direction in association with the target object and comprises a plurality of guide partition plates extending along an inner wall of the cooling gas passage to partition the plurality of gas discharge ports,
wherein the cooling mechanism is disposed in the atmospheric transfer chamber,
wherein a horizontal level of each of the plurality of gas discharge ports except an uppermost first gas discharge port is set to be located between adjacent target objects vertically supported at a plurality of stages, with the uppermost first gas discharge port and a second gas discharge port being set to be located at a horizontal level between a target object supported by an uppermost first support stand and a target supported by a second support stand, and
wherein the down-flow is in direct contact with the target object supported by the uppermost first support stand.

2. The cooling mechanism of claim 1, wherein each of the guide partition plates includes a vertical portion, a curved portion and a horizontal portion.

3. The cooling mechanism of claim 1, wherein opening areas of the gas discharge ports are set such that flow velocities of the cooling gas from the gas discharge ports become equal to one another.

4. The cooling mechanism of claim 3, wherein a flow velocity of the cooling gas is within a range of 0.3 m/sec to 1.5 m/sec.

5. The cooling mechanism of claim 1, wherein the cooling gas passage is a passage for flowing an inert gas.

6. A processing system comprising:
an atmospheric transfer chamber maintained at an air atmosphere;
a plurality of process chambers coupled to the atmospheric transfer chamber and configured to perform a predetermined process for a target object under the air atmosphere;
the cooling mechanism of claim 1 disposed at one side of the atmospheric transfer chamber and configured to cool the target object; and
a transfer mechanism disposed in a central portion of the atmospheric transfer chamber and configured to transfer the target object between the process chambers and the cooling mechanism.

7. The processing system of claim 6, wherein the transfer mechanism includes a high temperature pick for holding the target object of a high temperature and a low temperature pick for holding the target object of a low temperature.

8. The processing system of claim 7, wherein each of the high temperature pick and the low temperature pick comprises a detection sensor configured to detect presence of the target object.

9. The processing system of claim 8, wherein the detection sensor includes a light emitting element and a light receiving element and an optical axis of the light emitting element is set to be slightly oblique with respect to a plane direction of the target object while passing through a plane of the target object.

10. The processing system of claim 6, wherein a down-flow of cleaning gas is formed in the atmospheric transfer chamber.

11. The cooling mechanism of claim 1, wherein the down-flow is introduced from a ceiling of the atmospheric transfer chamber over the entire region therein.

12. The processing system of claim 6, wherein the down-flow is introduced from a ceiling of the atmospheric transfer chamber over the entire region therein.

* * * * *